(12) United States Patent
Liaw et al.

(10) Patent No.: US 9,941,173 B2
(45) Date of Patent: Apr. 10, 2018

(54) MEMORY CELL LAYOUT

(71) Applicant: Taiwan Semiconductor Manufacturing Company, Ltd., Hsin-Chu (TW)

(72) Inventors: Jhon-Jhy Liaw, Zhudong Township (TW); Chang-Yun Chang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 71 days.

(21) Appl. No.: 15/174,278

(22) Filed: Jun. 6, 2016

(65) Prior Publication Data

US 2016/0284600 A1    Sep. 29, 2016

Related U.S. Application Data

(63) Continuation of application No. 12/702,177, filed on Feb. 8, 2010, now Pat. No. 9,362,290.

(51) Int. Cl.
*H01L 21/8238* (2006.01)
*G11C 11/412* (2006.01)
(Continued)

(52) U.S. Cl.
CPC .... *H01L 21/823807* (2013.01); *G11C 11/412* (2013.01); *H01L 21/0337* (2013.01);
(Continued)

(58) Field of Classification Search
CPC ... A61B 5/0095; A61B 8/4209; A61B 8/4438; A61B 8/4444; G01H 9/008; G01N 29/2418; G11C 11/412; H01L 21/0337; H01L 21/3065; H01L 21/308; H01L 21/3086; H01L 21/32139;
(Continued)

(56) References Cited

U.S. PATENT DOCUMENTS

| 5,013,680 A * | 5/1991 | Lowrey | ................. H01L 21/033 257/E21.033 |
| 6,347,062 B2 | 2/2002 | Nii et al. | |

(Continued)

FOREIGN PATENT DOCUMENTS

| CN | 101335182 A | 12/2008 |
| JP | 2002043441 A | 2/2002 |

(Continued)

OTHER PUBLICATIONS

Ishida, M. et al., "A Novel 6T-SRAM Cell Technology Designed with Rectangular Patterns Scalable beyond 0.18 μm Generation and Desirable for Ultra High Speed Operation," Electron Devices Meeting 1998, IEDM Technical Digest International, pp. 201-204.

*Primary Examiner* — Mohammed Shamsuzzaman
(74) *Attorney, Agent, or Firm* — Slater Matsil, LLP

(57) ABSTRACT

A system and method for a memory cell layout is disclosed. An embodiment comprises forming dummy layers and spacers along the sidewalls of the dummy layer. Once the spacers have been formed, the dummy layers may be removed and the spacers may be used as a mask. By using the spacers instead of a standard lithographic process, the inherent limitations of the lithographic process can be avoided and further scaling of FinFET devices can be achieved.

20 Claims, 21 Drawing Sheets

(51) Int. Cl.
  *H01L 21/033*      (2006.01)
  *H01L 21/308*      (2006.01)
  *H01L 21/3213*     (2006.01)
  *H01L 29/66*       (2006.01)
  *H01L 27/11*       (2006.01)
  *H01L 21/3065*     (2006.01)

(52) U.S. Cl.
  CPC ........ *H01L 21/308* (2013.01); *H01L 21/3065* (2013.01); *H01L 21/3086* (2013.01); *H01L 21/32139* (2013.01); *H01L 21/823821* (2013.01); *H01L 27/11* (2013.01); *H01L 27/1104* (2013.01); *H01L 27/1116* (2013.01); *H01L 29/66545* (2013.01); *H01L 29/66795* (2013.01)

(58) Field of Classification Search
  CPC ..... H01L 21/823807; H01L 21/823821; H01L 27/11; H01L 27/1104; H01L 27/1116; H01L 29/66545; H01L 29/66795
  USPC .................................................. 438/585, 199
  See application file for complete search history.

(56) References Cited

U.S. PATENT DOCUMENTS

| | | |
|---|---|---|
| 6,706,571 B1 | 3/2004 | Yu et al. |
| 6,858,478 B2 | 2/2005 | Chau et al. |
| 7,190,050 B2 | 3/2007 | King et al. |
| 7,247,887 B2 | 7/2007 | King et al. |
| 7,265,008 B2 | 9/2007 | King et al. |
| 7,456,481 B2 | 11/2008 | Inaba et al. |
| 7,508,031 B2 | 3/2009 | Liu et al. |
| 7,528,465 B2 | 5/2009 | King et al. |
| 7,605,449 B2 | 10/2009 | Liu et al. |
| 7,820,512 B2 | 10/2010 | Pillarisetty et al. |
| 7,829,951 B2 | 11/2010 | Song et al. |
| 8,169,025 B2* | 5/2012 | Bedell ................... H01L 21/845 257/351 |
| 8,329,592 B2 | 12/2012 | Inaba |
| 8,497,198 B2 | 7/2013 | Chien et al. |
| 8,847,361 B2 | 9/2014 | Liaw et al. |
| 2005/0153490 A1 | 7/2005 | Yoon et al. |
| 2005/0237850 A1 | 10/2005 | Datta et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0249174 A1* | 10/2007 | Yang ................... H01L 21/0334 438/712 |
| 2008/0290470 A1 | 11/2008 | King et al. |
| 2008/0296632 A1 | 12/2008 | Moroz et al. |
| 2008/0308848 A1 | 12/2008 | Inaba |
| 2008/0308880 A1 | 12/2008 | Inaba |
| 2009/0181477 A1 | 7/2009 | King et al. |
| 2011/0147839 A1 | 6/2011 | Yagishita et al. |
| 2014/0106528 A1 | 4/2014 | Quyang et al. |
| 2014/0191323 A1 | 7/2014 | Bergendahl et al. |

FOREIGN PATENT DOCUMENTS

| | | |
|---|---|---|
| JP | 2008117816 A | 5/2008 |
| JP | 2008311503 A | 12/2008 |
| JP | 2010171106 A | 8/2010 |
| JP | 2012505552 A | 3/2012 |

* cited by examiner

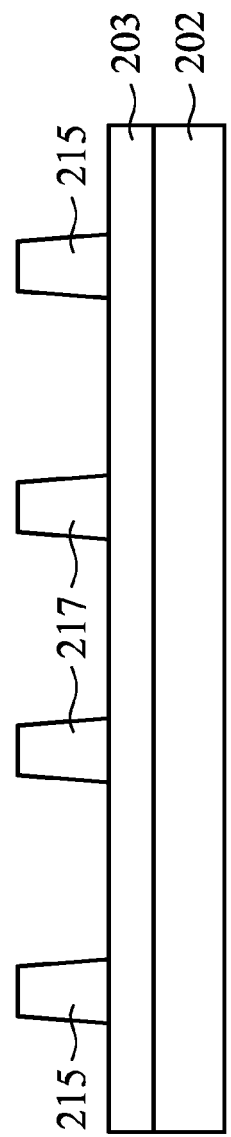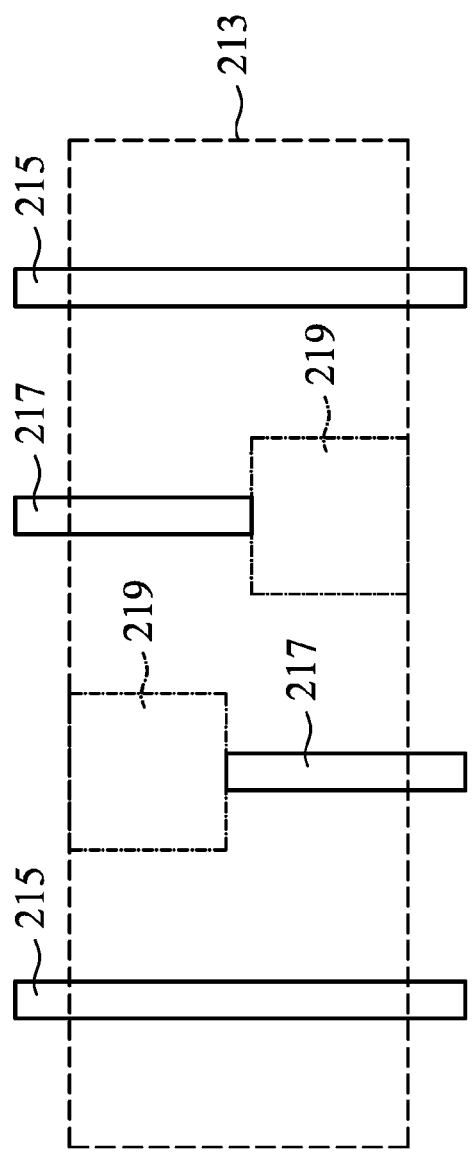

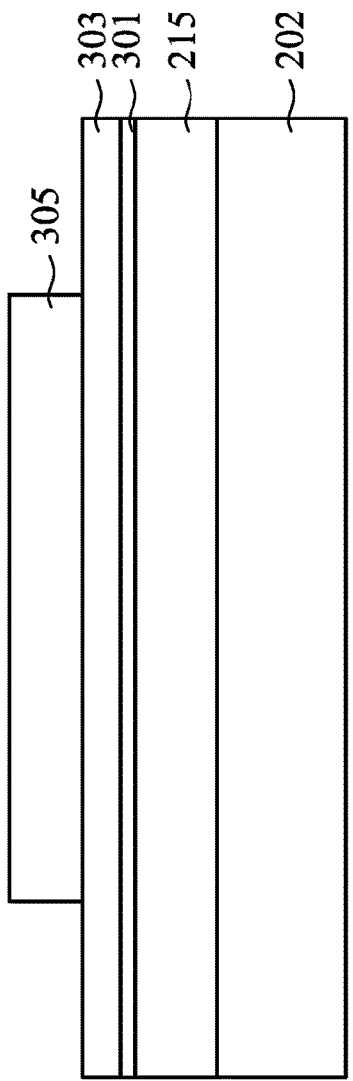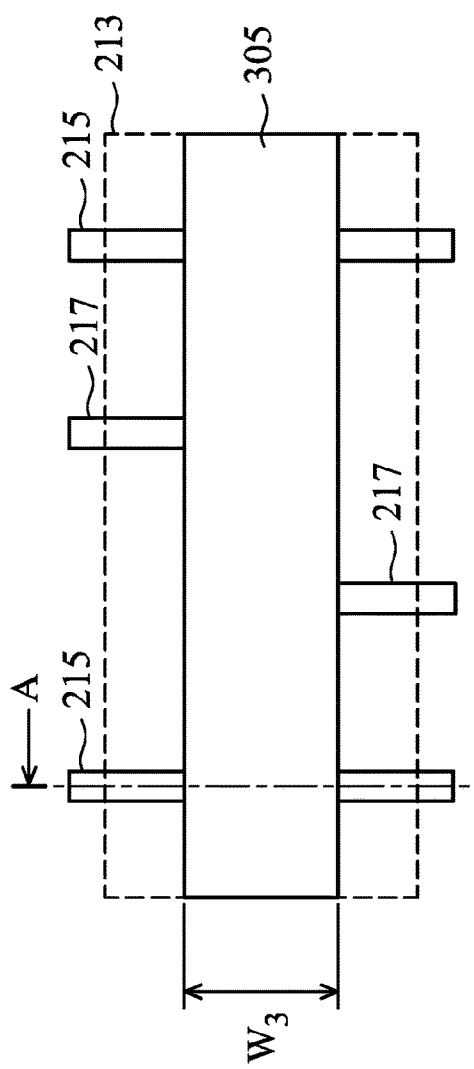
Figure 3A
Figure 3B

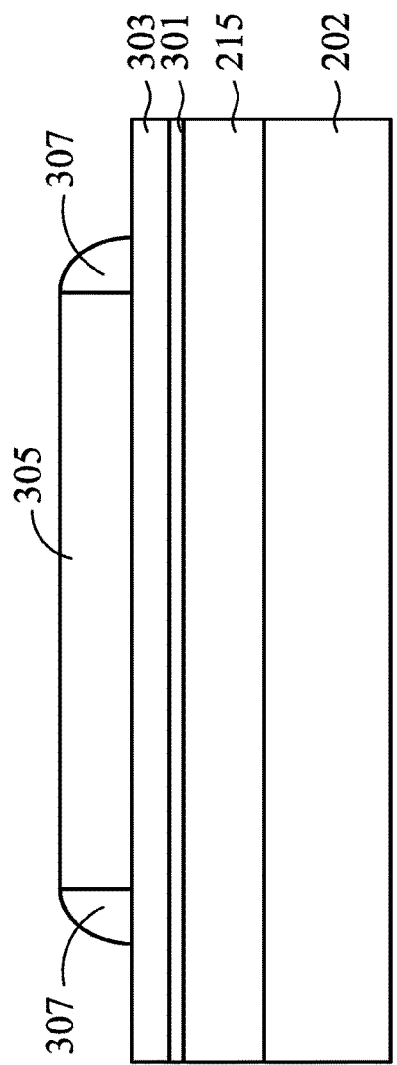
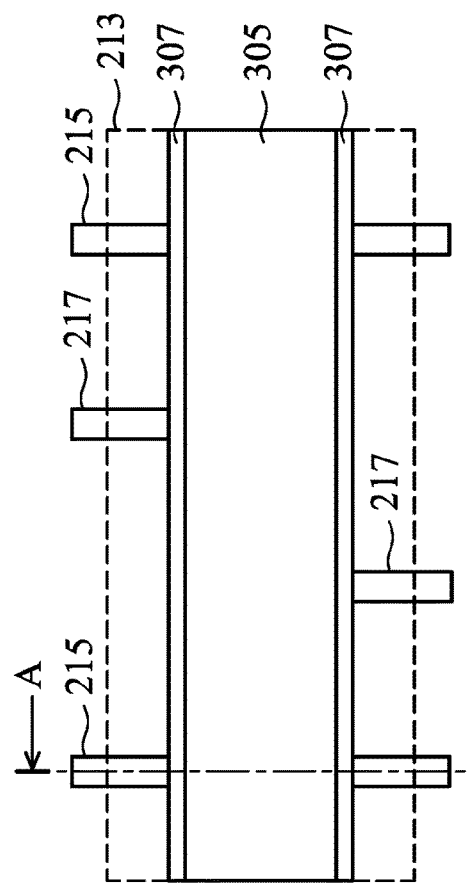

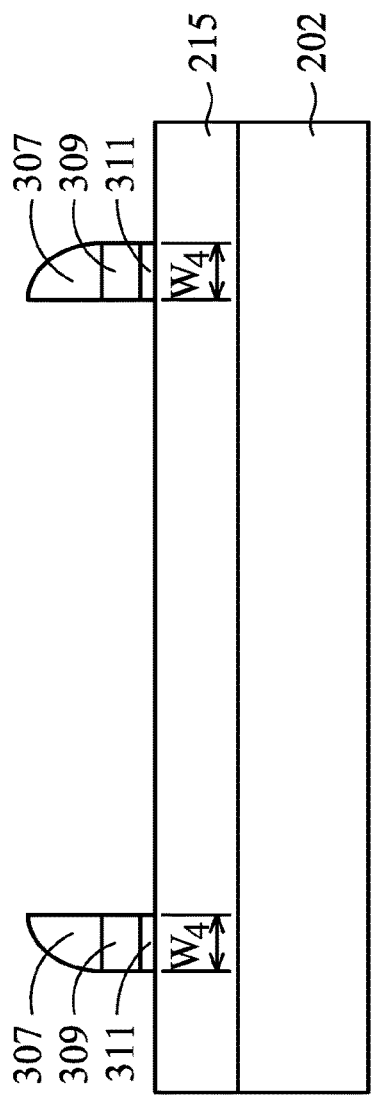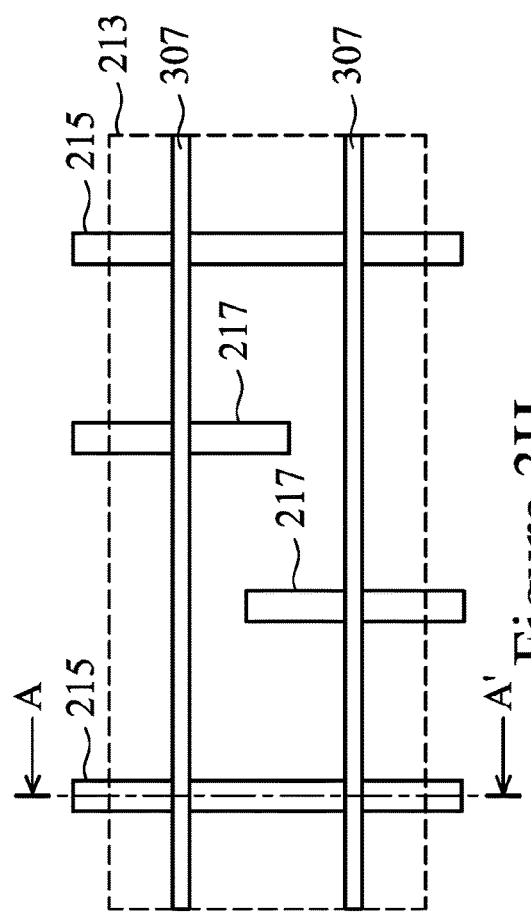

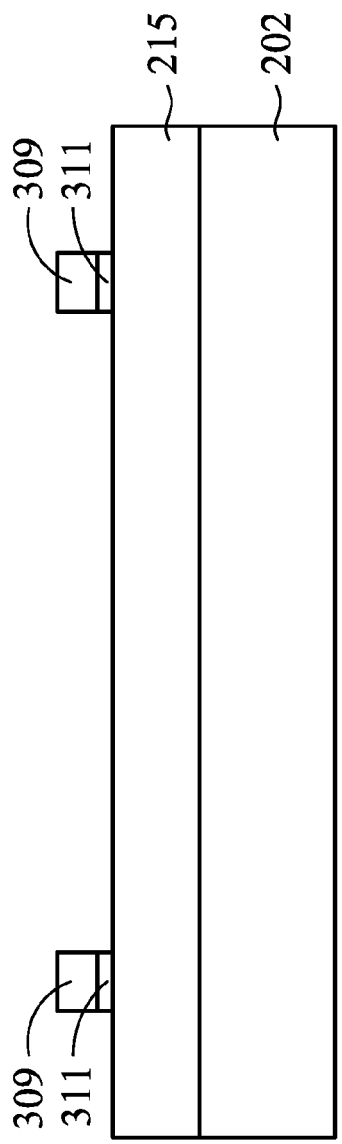
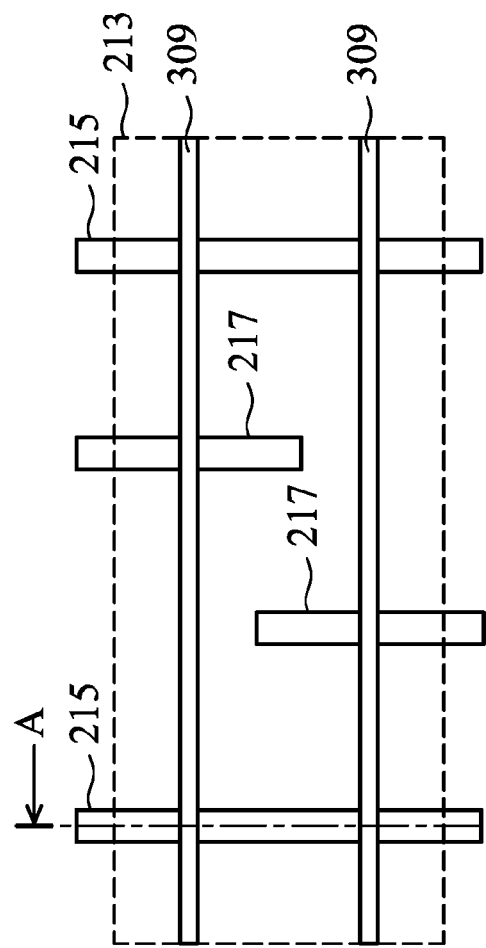

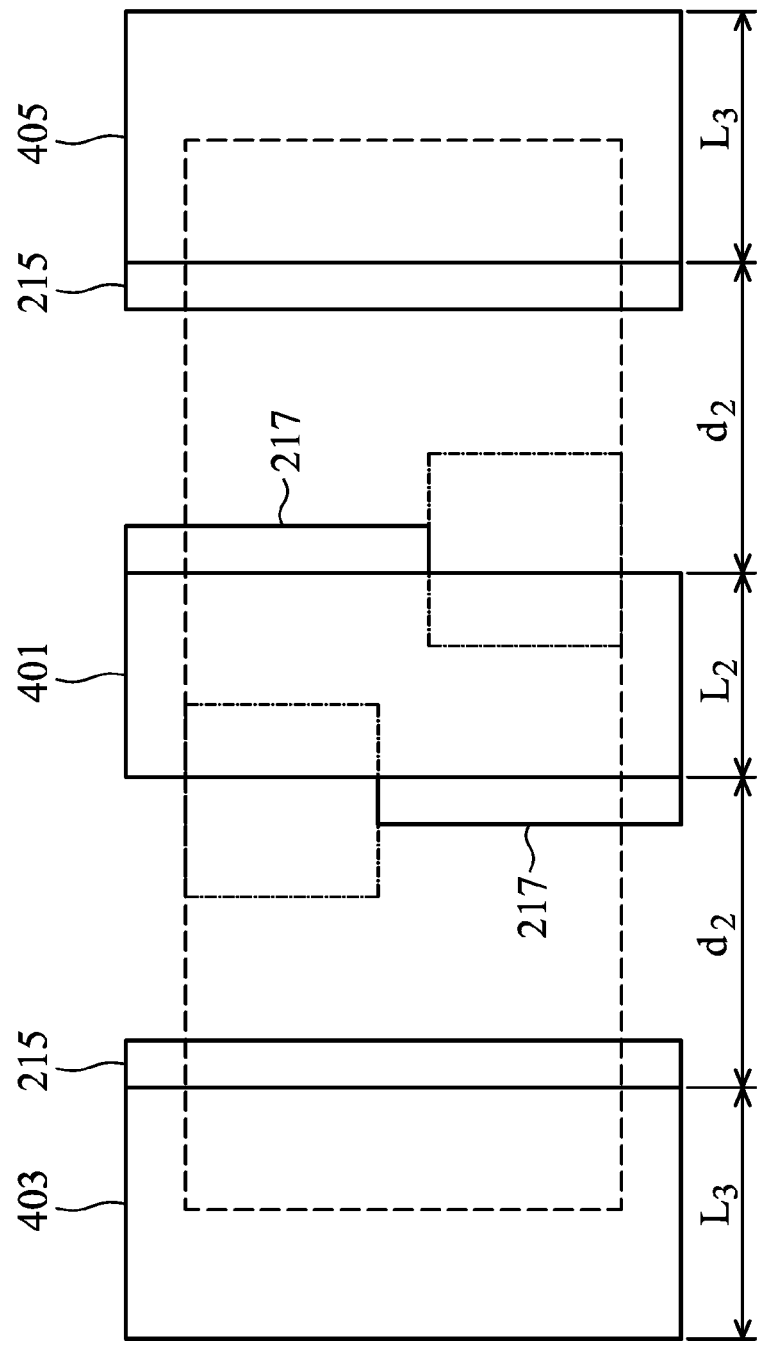

MEMORY CELL LAYOUT

This application is a continuation of U.S. patent application Ser. No. 12/702,177, filed Feb. 8, 2010, and entitled "Memory Cell Layout," which application is hereby incorporated herein by reference.

TECHNICAL FIELD

The present application relates generally to a system and method for semiconductor devices and, more particularly, to a system and method for static random access memory devices.

BACKGROUND

As semiconductor devices such as static random access memories (SRAMs) are scaled down into the 32 nm generations and beyond, Fin Field Effect Transistors (FinFETs), which utilize a "fin" to form multiple channel regions, have become popular over the more standard planar transistors. These FinFETs provide for larger channel widths by using not only the top surface of the fin, as would be used in a planar transistor, but also the sidewalls of the fin. By using these FinFET designs deleterious short-channel effects, such as variability in the threshold voltage and excessive drain leakage currents, can be suppressed or reduced, thereby allowing for a more efficient device.

However, the use of FinFETs has encountered problems. Standard lithographic techniques, which have traditionally been used to both form the fins as well as the gate electrodes that lie over the fins, have become untenable as a primary manufacturing technology for FinFETs. Fundamental limitations involved with the lithographic process limit its usefulness in forming fins and gate electrodes as FinFETs are scaled to smaller and smaller dimensions. In other words, the standard lithographic process is itself limited and may be unable to scale downwards along with the scaling of the FinFETs that it is being used to manufacture.

As such, other manufacturing processes need to be developed in order to maintain the scaling that will be required for further reductions of FinFETs.

SUMMARY

These and other problems are generally solved or circumvented, and technical advantages are generally achieved, by embodiments which an SRAM cell layout manufactured using dummy layers and spacers.

In accordance with an embodiment, a method for manufacturing an SRAM comprises providing a substrate and forming a first dummy pattern over the substrate. A first spacer is formed along at least one sidewall of the first dummy pattern. The first dummy pattern is removed and a first fin of the SRAM is formed by removing portions of the substrate uncovered by the spacers.

In accordance with another embodiment, a method for manufacturing a semiconductor device comprises providing a fin and forming a gate dielectric layer and gate electrode layer over the fin. A first dummy pattern is formed over the gate electrode layer, and first spacers are formed along the sidewalls of the first dummy pattern. The first dummy pattern is removed while maintaining the first spacers, and the gate dielectric layer and the gate electrode layer are patterned using the first spacers as a mask.

In accordance with another embodiment, a method for manufacturing a semiconductor device comprises providing a substrate and patterning the substrate to form a plurality of fins. The patterning the substrate further comprises forming a first dummy pattern over the substrate, forming first spacers along the sidewalls of the first dummy patter, removing the first dummy pattern, and removing exposed portions of the substrate. A gate electrode layer is formed over the plurality of fins, and the gate electrode layer is patterned to form gate electrodes. The patterning the gate electrode layer further comprising forming a second dummy pattern over the gate electrode layer, forming second spacers along sidewalls of the second dummy pattern, removing the second dummy pattern, and removing exposed portions of the gate electrode layer.

An advantage of an embodiment includes reducing the dimensions of the structure beyond the inherent limitations of a photolithographic process.

BRIEF DESCRIPTION OF THE DRAWINGS

For a more complete understanding of embodiments, and the advantages thereof, reference is now made to the following descriptions taken in conjunction with the accompanying drawings, in which:

FIGS. 2A-2I illustrate process steps in the formation of a fin in accordance with an embodiment;

FIGS. 3A-3M illustrate process steps in the formation of a memory device in accordance with an embodiment;

FIG. 4 illustrates usage of three dummy layers in the formation of fins in accordance with an embodiment;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that embodiments provide many applicable inventive concepts that can be embodied in a wide variety of specific contexts. The specific embodiments discussed are merely illustrative of specific ways to make and use embodiments, and do not limit the scope.

Embodiments will be described with respect to a specific context, namely a SRAM cell layout. Embodiments may also be applied, however, to other cell layouts.

Figure 1:
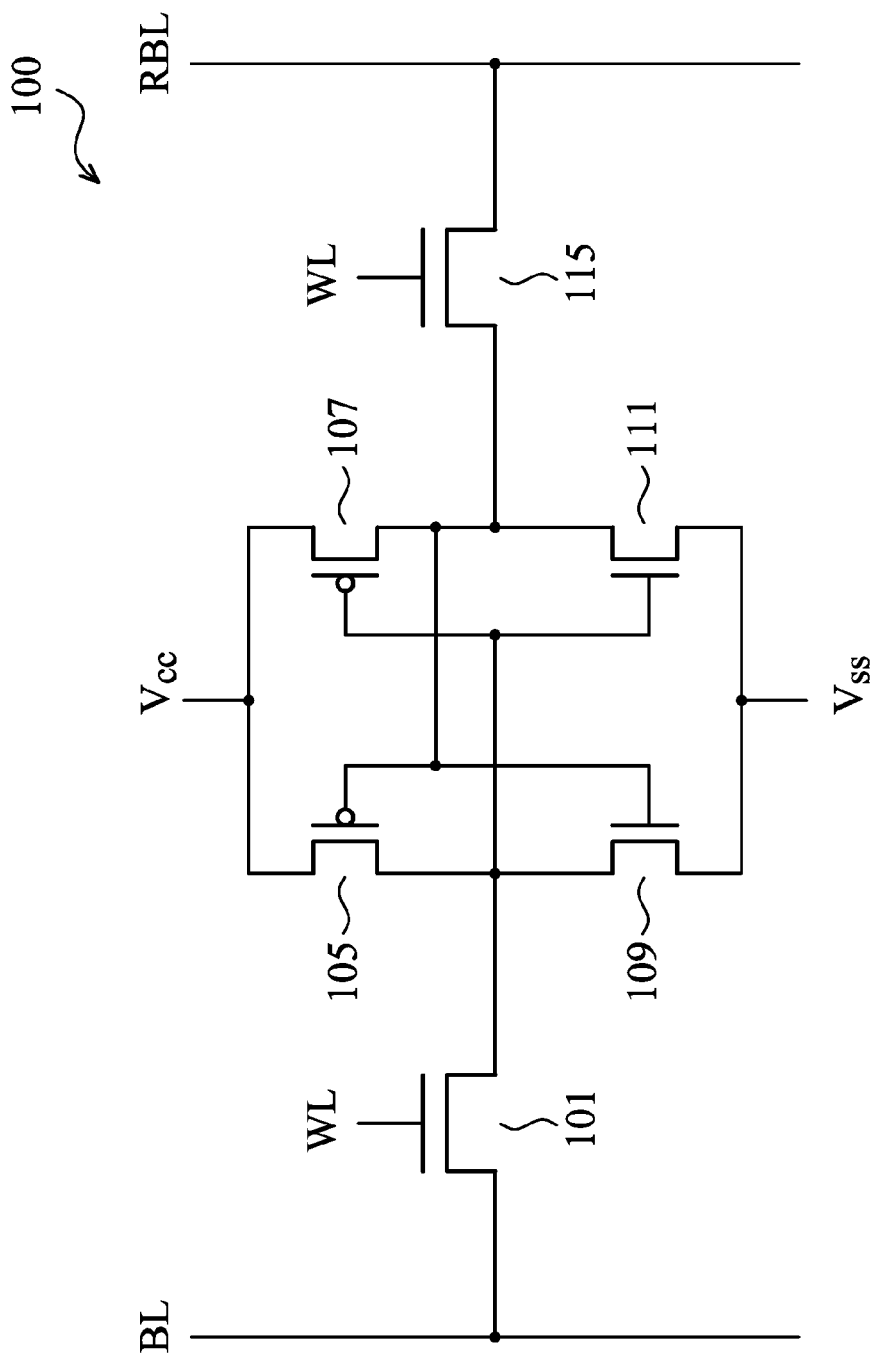
FIG. 1 illustrates a memory device in accordance with an embodiment.

With reference now to FIG. 1, there is shown a schematic diagram of a memory device 100, in accordance with an embodiment. A first pull-up transistor 105, a first pull-down transistor 109, a second pull-up transistor 107, and a second pull-down transistor 111 are electrically connected to form two cross-coupled inverters. The drains of the first pull-down transistor 109 and the first pull-up transistor 105 are electrically connected to the gates of the second pull-up transistor 107 and the second pull-down transistor 111, and the drains of the second pull-up transistor 107 and the second pull-down transistor 111 are electrically connected to the gates of the first pull-up transistor 105 and the first pull-down transistor 109.

The memory device 100 also consists of a first pass-gate transistor 101 and a second pass-gate transistor 115. In an embodiment, the pass-gate transistors, such as the first pass-gate transistor 101 or the second pass-gate transistor 115, may have a longer gate length than the pull-down devices, such as the first pull-down transistor 109 or the second pull-down transistor 111. The gates of the pass-gate transistors are connected to a word line WL that controls access to the memory cell 100 in order to read or write to the memory cell (these functions are described below). The first pass-gate transistor 101 is connected to a bit line (BL) and the second pass-gate transistor 115 is connected to a complementary bit line (RBL). The first pass-gate transistor 101 is connected to a common node with the first pull-down transistor 109 and the first pull-up transistor 105. The second pass-gate transistor 115 is connected to a common node with the second pull-down transistor 111 and the second pull-up transistor 107.

In the embodiment illustrated by FIG. 1, the memory device 100 is written to by applying a high voltage to the word line WL to turn on the first pass-gate transistor 101 and the second pass-gate transistor 115. With the pass-gate transistors open, the bit line BL and the complementary bit line RBL can all be used to write to the memory device 100.

To read from this embodiment, a high voltage is applied to the word line WL to turn on the first pass-gate transistor 101 and the second pass-gate transistor 115. With the pass-gate transistors open, the bit line BL and the complementary bit line RBL can be used to read the memory device 100.

Figure 2A:
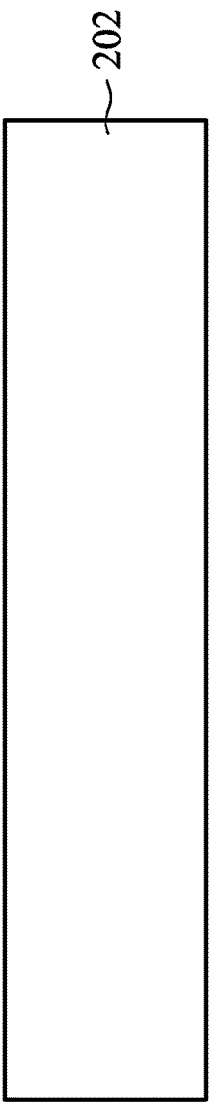

FIG. 2A illustrates a cross-sectional view of a semiconductor substrate 202. The substrate 202 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium-on-insulator (SGOI), or combinations thereof. Other substrates that may be used include multi-layered substrates, gradient substrates, or hybrid orientation substrates.

Figure 2B:
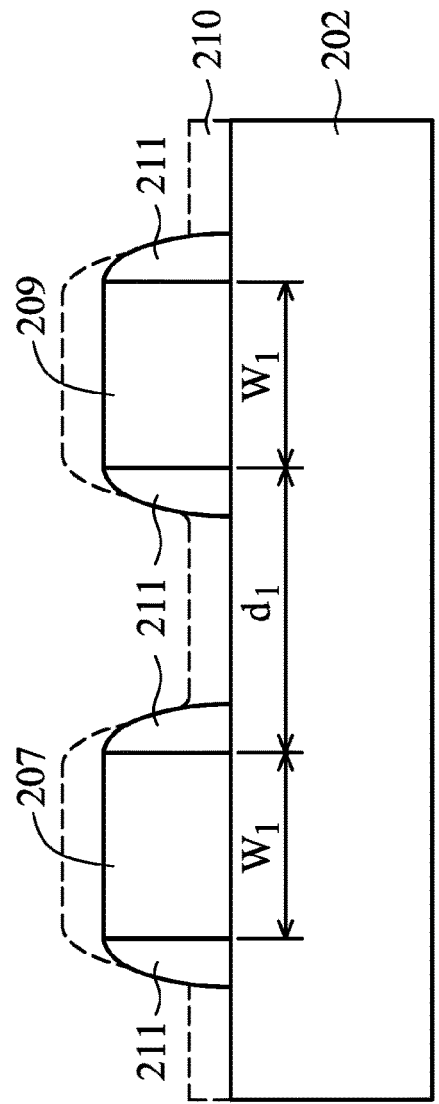
Figure 2C:
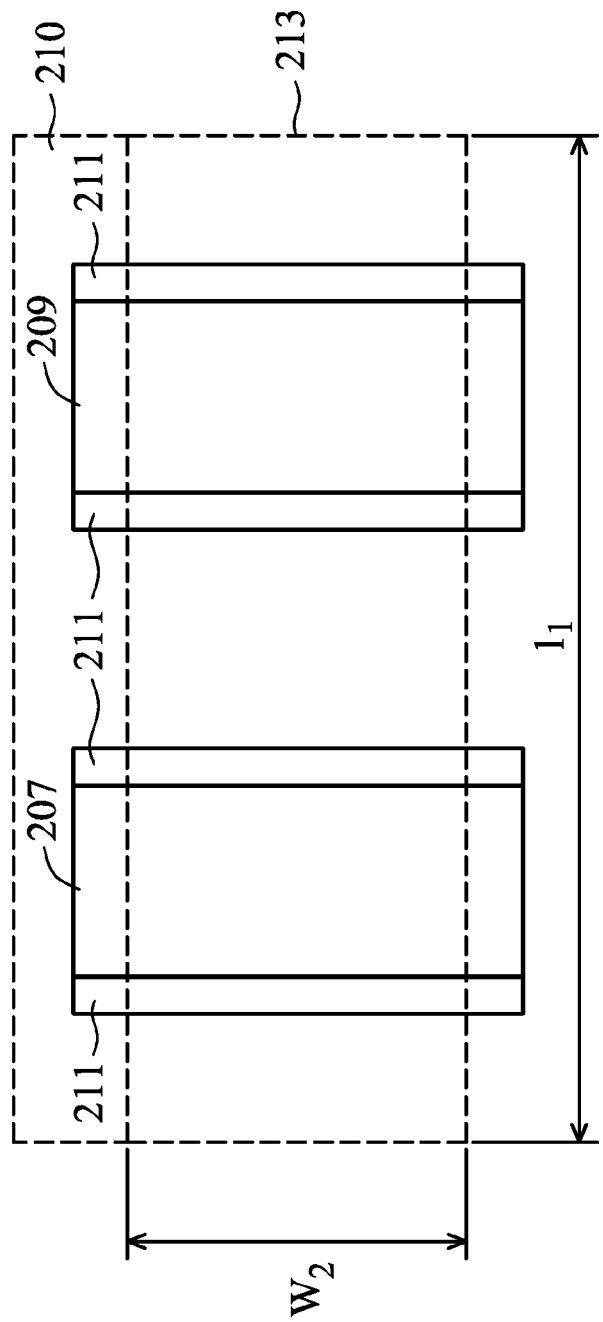

FIGS. 2B and 2C illustrate a cross-sectional view and a plan view, respectively, of the formation of a first dummy layer 207, a second dummy layer 209 and first spacers 211. The first dummy layer 207 and second dummy layer 209 are each formed such that they define the dimensions of later-formed fins 215 (described below with respect to FIG. 2F). As such, the first dummy layer 207 and second dummy layer 209 may be formed parallel to each other and may have a similar first width $w_1$ of between about 0.02 μm and about 0.2 μm, such as about 0.08 μm. Additionally, the first dummy layer 207 and second dummy layer 209 may be spaced apart from one another a first distance $d_1$ of between about 0.05 μm and about 1 μm, such as about 0.1 μm.

The first dummy layer 207 and second dummy layer 209 may be formed by patterning a first initial dielectric layer (not shown) that is formed using a suitable process of formation such as CVD, PECVD, etc. The first initial dielectric layer may be formed of a dielectric material such as an oxide, a nitride, a silicon oxynitride, combinations of these, or the like, and may be formed to have a thickness of between about 200 Å and about 2,000 Å, such as about 500 Å. Once the initial dielectric layer has been formed, the initial dielectric layer may be patterned to form the first dummy layer 207 and the second dummy layer 209. The patterning may be performed using a suitable masking and removal process, such as a photolithographic and etching process, although any suitable process may be utilized.

First spacers 211 are formed along the sidewalls of the first dummy layer 207 and the second dummy layer 209. The first spacers 211 may be formed by blanket depositing a spacer layer (illustrated in FIGS. 2B and 2C by the dashed line 210) over the previously formed structure. The spacer layer may comprise SiN, oxynitride, SiC, SiON, oxide, and the like and may be formed by commonly used methods such as chemical vapor deposition (CVD), plasma enhanced CVD, sputter, and other methods known in the art. The spacer layer 210 may be formed to a thickness of between about 10 Å and about 700 Å, such as about 30 Å. The first spacers 211 are then patterned, such as by anisotropically etching and removing the spacer layer 210 from the horizontal surfaces of the structure.

FIG. 2C is a plan view of a unit cell 213 into which the memory device 100 will be manufactured. In this figure the unit cell 213 is represented by a dotted line. However, it should be noted that the boundary of the unit cell 213 may not be readily apparent in a finished product. Rather, the unit cell 213 defines the basic building block for designing memory arrays. Memory devices typically have one or more memory arrays. The unit cell 213 may be duplicated any number of times (e.g., thousands, millions, billions, trillions, or more) to create memories capable of storing various amounts of data. The unit cell 213 may have a second width $w_2$ of between about 0.05 μm and about 0.3 μm, such as about 0.2 μm, and may have a first length $l_1$ of between about 0.1 μm and about 1.1 μm, such as about 0.5 μm.

Figure 2D:
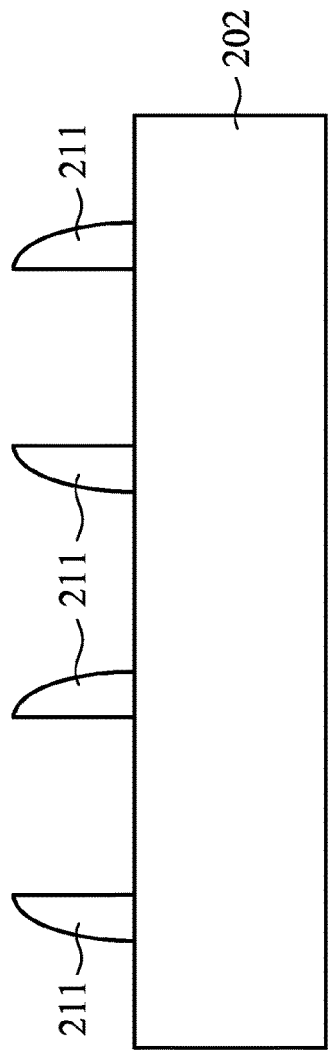
Figure 2E:
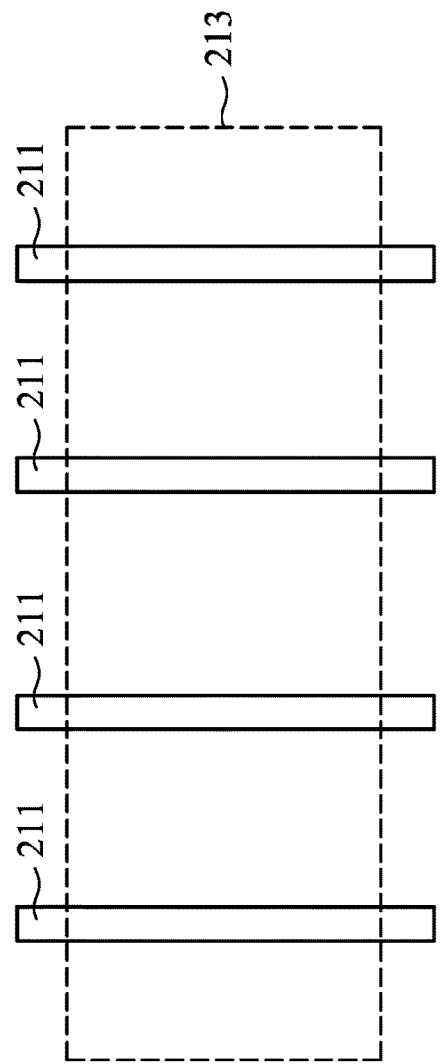

FIGS. 2D and 2E illustrate a cross-sectional view and a plan view, respectively, of the removal of the first dummy layer 207 and second dummy layer 209 after the formation of the first spacers 211. In an embodiment the first dummy layer 207 and the second dummy layer 209 may be removed using a wet etch, although any suitable etching technique, such as a dry etch may alternatively be utilized. For example, if silicon oxide is utilized to form the first dummy layer 207 and the second dummy layer 209, then an etchant such as HF may be utilized to remove the first dummy layer 207 and the second dummy layer 209 without significantly removing any of the first spacers 211.

By forming the first spacers 211 in this fashion, the formation of the first spacers 211 may be performed without the use of lithography and its inherent limitations. By by-passing the lithographic process for the first spacers 211, the first spacers 211 are not bound by the inherent limitations of the lithographic process. Without these limitations, the first spacers 211 may be formed to smaller dimensions than allowed if lithographic processes were utilized to form the first spacers 211.

Figure 2F:
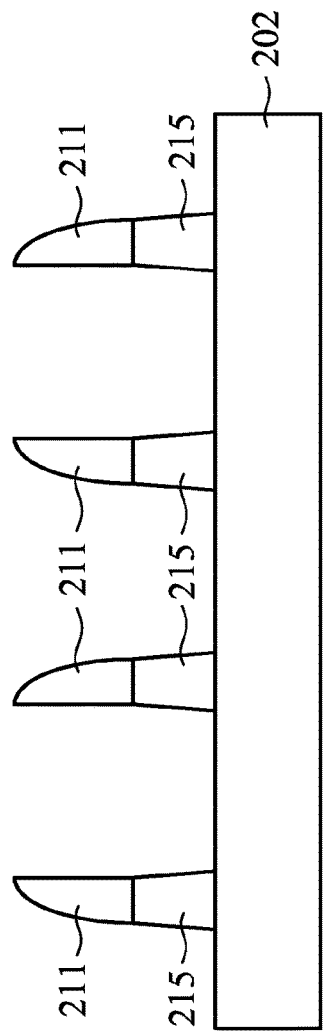
Figure 2G:
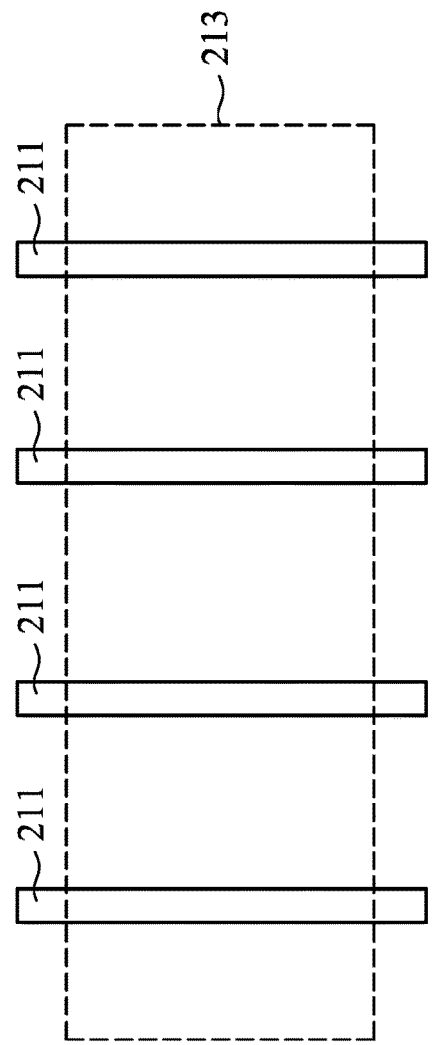

FIGS. 2F-2G illustrate a cross-sectional view and a plan view, respectively, of the formation of fins 215 from the substrate 202 (see FIG. 2D). In an embodiment each of the first spacers 211 are used as a mask in order to form fins 215 under each of the first spacers 211 that had been defined by the first dummy layer 207 and the second dummy layer 209. The fins 215 are formed by protecting those regions of the substrate 202 which will become the fins 215 while the unprotected portions of the substrate 202 are removed using, for example, a dry etch such as a reactive ion etch (RIE) process. The removal process may be continued until the fins 215 have a first height of between about 200 Å to about 5,000 Å, such as about 600 Å. FIGS. 2H and 2I illustrate a cross-sectional view and a plan view, respectively, of the removal of the first spacers 211 and the etching of two of the fins 215 to form discontinuous fins 217. The first spacers 211 may be removed using a wet etch that is selective to the spacer material such that it will remove the first spacers 211 without significantly removing any other exposed material. For example, if silicon nitride were used as the spacer material, then an etchant such as $H_3NO_4$ may be used to selectively remove the first spacers 211. However, any suitable removal process, such as selectively removing the first spacers 211 using an additional lithographic step, may alternatively be utilized to remove the first spacers 211.

Additionally, FIG. 2I illustrates an additional patterning of two of the fins 215 to form discontinuous fins 217 (with the discontinuity represented in FIG. 2I by the dashed line 219). The discontinuous fins 217 are useful in the formation of the memory device 100 in the unit cell 213 so that there is not a single continuous fin where it is not desired. As reduced dimensions are not as important for this process as in the formation of the fins 215, this patterning of the fins 215 may be performed using either a similar process as described above or else a suitable masking and removal process, such as a photolithographic and etching process. In an embodiment, the discontinuous fins 217 are formed to have a discontinuity of between about 0.02 µm and about 1 µm, such as about 0.15 µm.

Alternatively, the patterning of the discontinuous fins 217 may be performed during the formation of the fins 215 by removing the first spacers 211 from those portions of the fins 215 located within the discontinuities 219 prior to the formation of the fins 215. With the first spacers 211 removed, those portions of the fins 215 located within the discontinuities will be removed as the fins 215 are formed, thereby forming the discontinuous fins 217 along with the fins 215.

Optionally, a dielectric material (not shown), such as an oxide, may be deposited between the fins 215 and discontinuous fins 217 to further isolate the fin structures from each other. In an embodiment the dielectric material may be deposited using a process such as CVD and may then be chemically mechanically polished (CMP) to the level of the fins 215. Once planarized, the dielectric material may be recessed using, e.g., a wet etch, in order to extend the fins 215 and discontinuous fins 217 over the dielectric material for further processing.

FIGS. 3A-3B illustrate a cross-sectional view and a plan view, respectively, of the formation of a gate dielectric layer 301, gate electrode layer 303, and third dummy layer 305 over the fins 215 and discontinuous fins 217, with FIG. 3A being the cross-section through line A-A' in FIG. 3B. The gate dielectric layer 301 may be formed using thermal oxidation, chemical vapor deposition, sputtering, or any other methods known and used in the art for forming a gate dielectric. Depending on the technique of gate dielectric formation, the gate dielectric layer 301 thickness on the top of the fins 215 may be different from the gate dielectric thickness on the sidewall of the fins 215. The gate dielectric layer 301 may comprise a material such as silicon dioxide or silicon oxynitride, or high K dielectric, or combination with a thickness ranging from about 3 angstroms to about 100 angstroms, such as about less than 10 angstroms. The gate dielectric layer 301 may alternatively be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 3 angstroms to about 100 angstroms, such as about 10 angstroms or less.

The gate electrode layer 303 is formed over the gate dielectric layer 301. The gate electrode layer 303 comprises a conductive material and may be selected from a group comprising of polycrystalline-silicon (poly-Si), poly-crystalline silicon-germanium (poly-SiGe), metallic nitrides, metallic silicides, metallic oxides, and metals. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or combinations thereof. Examples of metallic oxides include ruthenium oxide, indium tin oxide, or their combinations. Examples of metal include tungsten, titanium, aluminum, copper, molybdenum, nickel, platinum, etc.

The gate electrode layer 303 may be deposited by chemical vapor deposition (CVD), sputter deposition, or other techniques known and used in the art for depositing conductive materials. The thickness of the gate electrode layer 303 may be in the range of about 100 angstroms to about 4,000 angstroms. The top surface of the gate electrode layer 303 usually has a non-planar top surface, and may be planarized prior to patterning of the gate electrode layer 303 or gate etch. Ions may or may not be introduced into the gate electrode layer 303 at this point. Ions may be introduced, for example, by ion implantation techniques.

The third dummy layer 305 is formed over the gate electrode layer 303 and is used to define the eventual gate electrodes desired. As such, the third dummy layer 305 has edges that cover a portion of each of the fins 215 and the discontinuous fins 217 located within the unit cell 213. For example, in a unit cell that has a second width $w_2$ of about 0.2 µm, the third dummy layer 305 may have a third width $w_3$ between a first desired gate electrode and a second desired gate electrode (described further below with respect to FIGS. 3G-3H) of between about 0.02 µm and about 0.3 µm, such as about 0.07 µm.

The third dummy layer 305 may be formed from similar materials and using similar processes as the first dummy layer 207 and the second dummy layer 209. For example, the third dummy layer 305 may be formed by depositing an initial dielectric layer (not shown), of either a single material or else a combination of materials, and then patterning the dielectric layer with a masking and etching process to obtain the desired pattern. However, these materials and processes are meant to be merely illustrative and are not meant to be limiting, as any suitable process and material for forming the third dummy layer 305 may alternatively be used.

FIGS. 3C and 3D illustrate a cross-sectional view and a plan view, respectively, of the formation of second spacers 307 along the sidewalls of the third dummy layer 305 with FIG. 3C being the cross-section through line A-A' in FIG. 3D. The second spacers 307 may be formed from similar material and a similar process as the first spacers 211 (described above with respect to FIG. 2B). For example, the second spacers 307 may be formed by blanket depositing a spacer layer (not shown) of SiN, $SiO_2$, or the like, using CVD, and then anisotropically etching the spacer layer to form the second spacers 307.

Figure 3E:
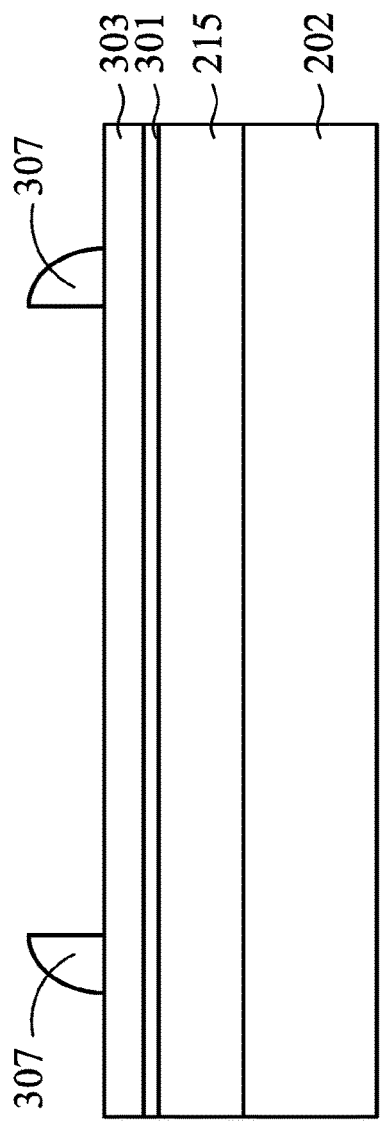
Figure 3F:
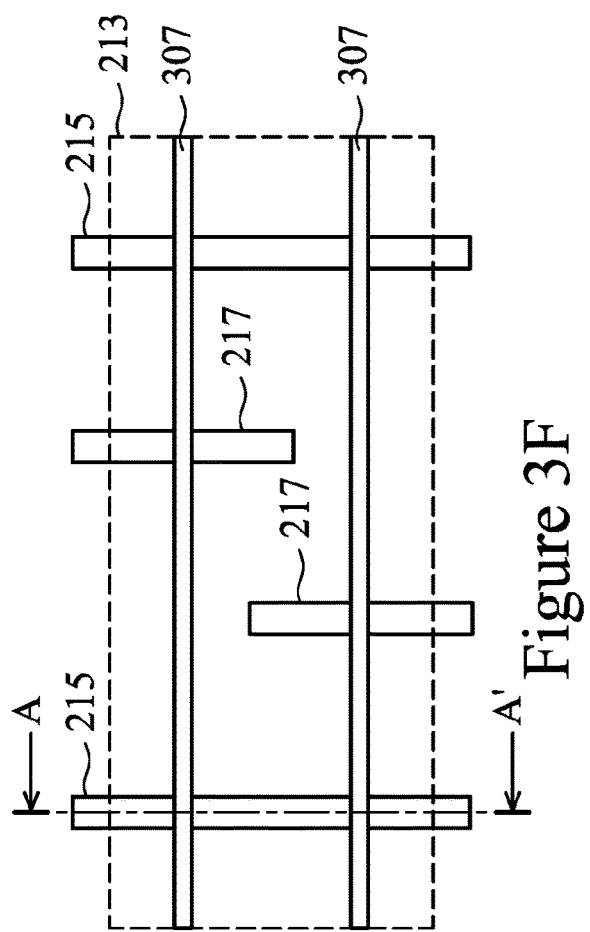

FIGS. 3E-3F illustrate a cross-sectional view and a plan view, respectively, of the removal of the third dummy layer 305 from in between the second spacers 307 with FIG. 3E being the cross-section through line A-A' in FIG. 3F. Similar to the removal of the first dummy layer 207 and the second dummy layer 209, the third dummy layer 305 may be removed using a wet etch, although any suitable etching technique, such as a dry etch, may alternatively be utilized.

As an example only, if silicon oxide is utilized to form the third dummy layer 305, then an etchant such as HF may be utilized to remove the third dummy layer 305 without significantly removing any of the second spacers 307.

By forming the second spacers 307 in this fashion, the second spacers 307, similar to the formation of the first spacers 211, do not utilize the lithographic process. By avoiding the use of lithography, the scaling of the second spacers 307 may also avoid the limitations of the lithography process. As such, the second spacers 307 may be formed to have smaller dimensions than a standard lithography process allows.

FIGS. 3G-3H illustrate a cross-sectional view and plan view, respectively, of the patterning of the gate electrode layer 303 and the gate dielectric layer 301 (see FIGS. 3A-3E) into a gate electrode 309 and gate dielectric 311 with FIG. 3G being the cross-section through line A-A' in FIG. 3H. The gate electrode layer 303 and the gate dielectric 301 are removed using the second spacers 307 as a mask, thereby transferring the width of the second spacers 307 to the underlying gate electrode 309 and gate dielectric 311. Given this, the gate dielectric 311 and gate electrode 309 may have a third width $w_4$ of between about 0.05 μm and about 0.3 μm, such as about 0.15 μm.

FIGS. 3I-3J illustrate the removal of the second spacers 307 from the gate dielectric 311 and gate electrode 309 with FIG. 3I being the cross-section through line A-A' in FIG. 3J. Similar to the removal of the first spacers 211 (described above with respect to FIGS. 2H-2I), the second spacers 307 may be removed using a wet etch that is selective to the spacer material such that it will remove the spacer material without significantly removing any other exposed material. For example, if silicon nitride were used as the spacer material, then an etchant such as $H_3NO_4$ may be used to selectively remove the second spacers 307. However, any suitable removal process may alternatively be utilized to remove the second spacers 307 while maintaining the gate electrode 309 and gate dielectric 311.

The memory device 100 may be completed through the formation of permanent spacers (not shown), source/drain regions (not shown), and silicide contacts (not shown). The permanent spacers may be formed on opposing sides of the gate electrode 309. The permanent spacers are typically formed by blanket depositing a spacer layer (not shown) on the previously formed structure. The spacer layer may comprise SiN, oxynitride, SiC, SiON, oxide, and the like and may be formed by methods utilized to form such a layer, such as chemical vapor deposition (CVD), plasma enhanced CVD, sputter, and other methods known in the art. The permanent spacers are then patterned, such as by anisotropically etching to remove the spacer layer from the horizontal surfaces of the structure.

Source/drain regions (not shown) may be formed in the exposed sections of the 215 by implanting appropriate dopants to complement the dopants in the fins 215. For example, p-type dopants such as boron, gallium, indium, or the like may be implanted to form a PMOS device. Alternatively, n-type dopants such as phosphorous, arsenic, antimony, or the like may be implanted to form an NMOS device. These source/drain regions are implanted using the gate electrode 309 and the permanent spacers as masks. It should be noted that one of ordinary skill in the art will realize that many other processes, steps, or the like may be used to form these source/drain regions. For example, one of ordinary skill in the art will realize that a plurality of implants may be performed using various combinations of spacers and liners to form source/drain regions having a specific shape or characteristic suitable for a particular purpose. Any of these processes may be used to form the source/drain regions, and the above description is not meant to limit embodiments to the steps presented above.

After the source/drain regions have been formed, an optional silicide process can be used to form silicide contacts along one or more of the top and sidewalls of the fins 215 over the source and drain regions. The silicide contacts may comprise nickel, cobalt, platinum, or erbium in order to reduce the Schottky barrier height of the contact. However, other commonly used metals, such as titanium, palladium, and the like, may also be used. As is known in the art, the silicidation may be performed by blanket deposition of an appropriate metal layer, followed by an annealing step which causes the metal to react with the underlying exposed silicon. Un-reacted metal is then removed, such as with a selective etch process. The thickness of the silicide contacts may be between about 5 nm and about 50 nm.

Figure 3K:
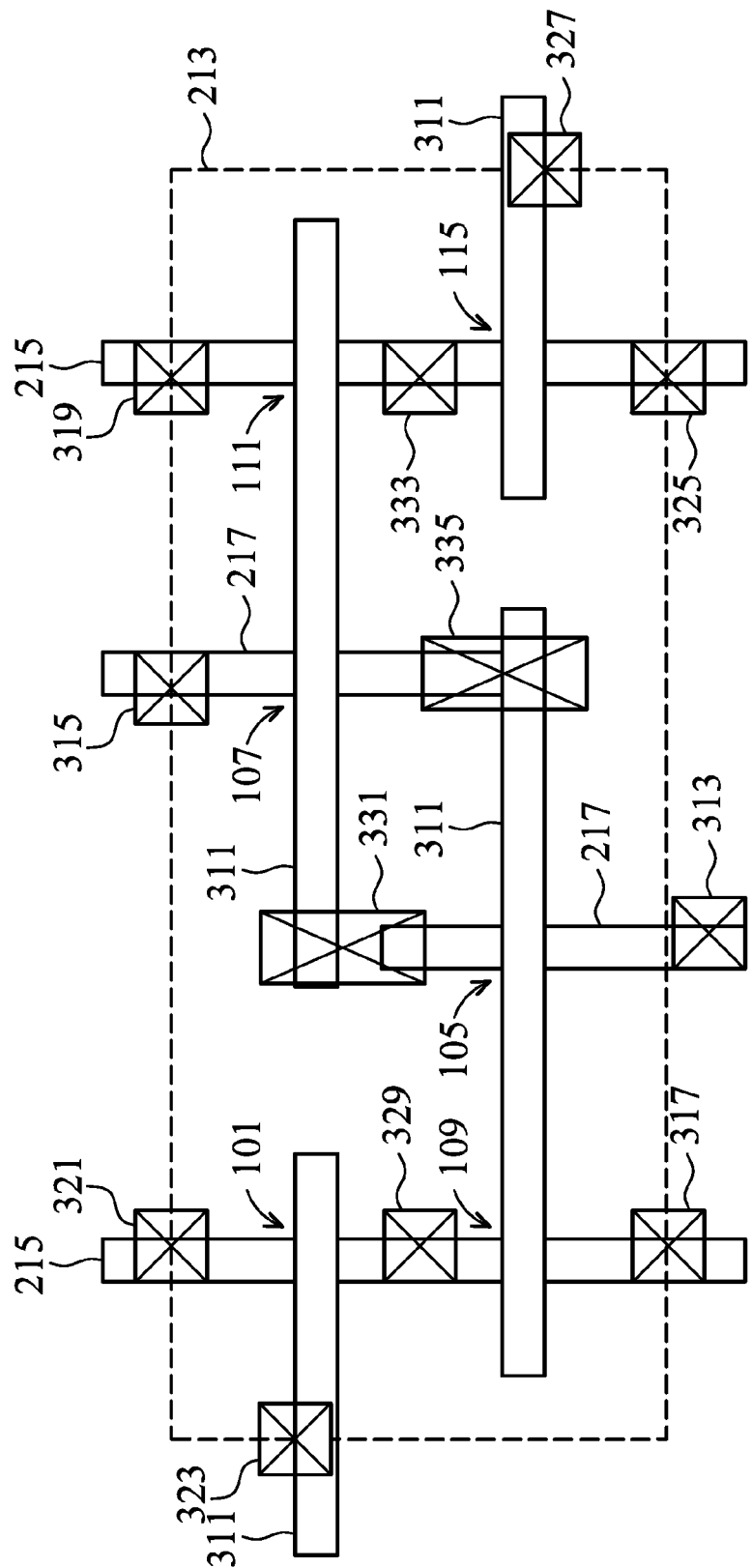

FIG. 3K illustrates a plan view of the patterning of the gate electrodes 311 along with the connectivity between the first pass-gate transistor 101, the second pass-gate transistor 115, the first pull-up transistor 105, the first pull-down transistor 109, the second pull-up transistor 107, and the second pull-down transistor 111. The gate electrodes 311 are patterned in order to separate the different transistors (e.g., the second pass-gate transistor 115 from the first pull-up transistor 105). The gate electrodes 311 may be patterned using a masking and removal process such as a photolithographic masking and etching, in order to separate the gate electrodes 311 and form the six transistors over the fins 215 and discontinuous fins 217.

As illustrated in FIG. 3K, the source of the first pull-up transistor 105 is electrically coupled with a voltage source $V_{cc}$ through plug 313, and the source of the second pull-up transistor 107 is electrically coupled to a voltage source $V_{cc}$ through plug 315. The source of the first pull-down transistor 109 is electrically coupled to a ground $V_{ss}$ via plug 317, and the drain of the first pull-down transistor 109 is electrically coupled through the fin 215 to the drain of the first pass-gate transistor 101. The source of the second pull-down transistor 111 is electrically coupled to a ground $V_{ss}$ via plug 319, and the drain of the second pull-down transistor 111 is electrically coupled through the fin 215 to the drain of the second pass-gate transistor 115.

The source of the first pass-gate transistor 101 is electrically coupled to the bit line BL (see FIG. 1) via a plug 321. The first pass-gate transistor 101 electrically couples the bit line BL to the drain of the first pull-down transistor 109 through the fin 215. The gate 311 of the first pass-gate transistor 101 is electrically coupled to the word line via a plug 323.

With further reference to the electrical connectivity of this embodiment shown in FIG. 3K, the source of the second pass-gate transistor 115 is electrically coupled to the complementary bit line RBL (see FIG. 1) via a plug 325. The second pass-gate transistor 115 electrically couples the complementary bit line RBL to the drain of the second pull-down transistor 111 through the fin 215. The gate electrode 311 of the second pass-gate transistor 115 is electrically coupled to the word line WL via a plug 327.

The drain of the first pull-up transistor 105, the drain of the first pull-down transistor 109, the drain of the first pass-gate transistor 101 and the gate electrodes 311 of the second pull-up transistor 107 and the second pull-down transistor 111 are electrically coupled via an intra-cell connection (not shown) and plugs 329 and 331. Similarly, the drain of the second pull-up transistor 107, the drain of the second pull-down transistor 111, the drain of the second pass-gate transistor 115, and the gate electrode 311 of the first pull-up transistor 105 and the first pull-down transistor 109 are electrically coupled via an intra-cell connection (not shown) and plugs 333 and 335. The intra-cell connections may be comprised of copper but optionally may be tungsten (W), an aluminum/copper (Al/Cu) alloy, Al, a refractory metal or metal compound, a metal silicide, combinations thereof, and the like.

Figure 3L:
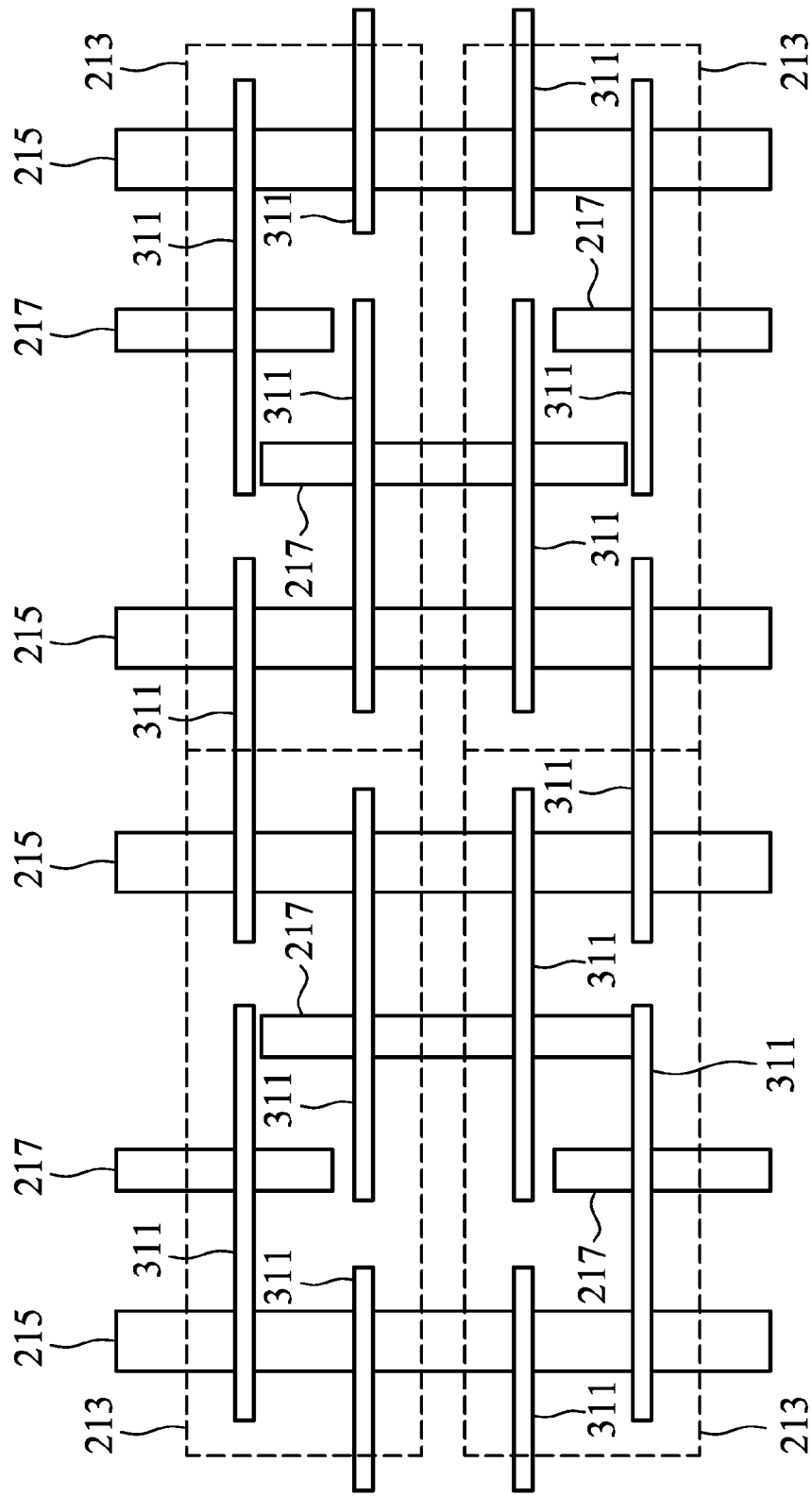

FIG. 3L illustrates an array of unit cells 213, each unit cell 213 comprising a single memory device 100. For clarity, FIG. 3L only illustrates two rows and two columns of the unit cell 213. However, any number of rows and columns may be utilized, and there are typically more than two rows and two columns utilized for a fully functioning device. As illustrated, the discontinuous fins 217 may extend between two different unit cells 213, while the fins 215 may extend across many more unit cells, such as four unit cells 213, or even more.

Figure 3M:
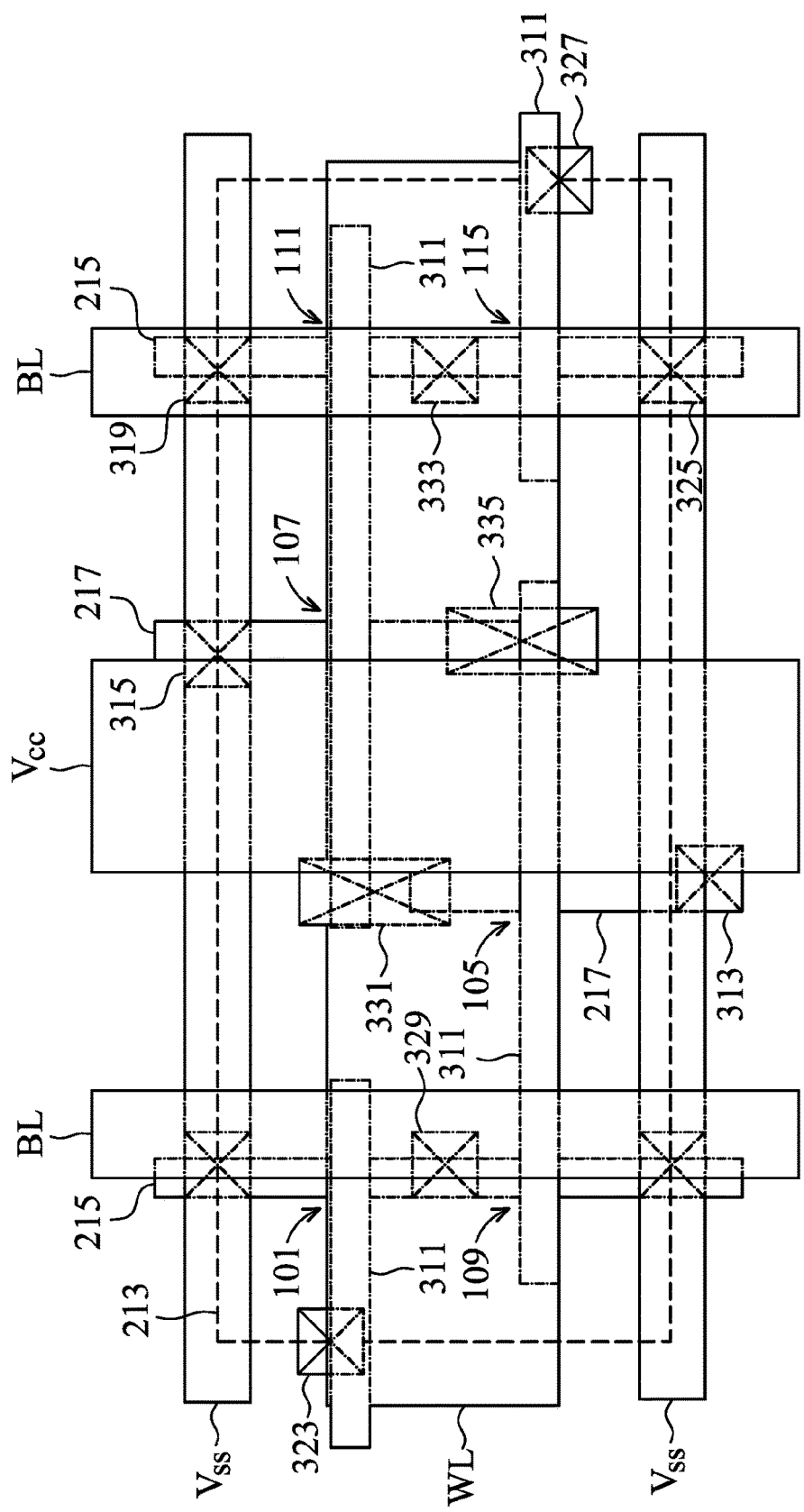

FIG. 3M illustrates the bit lines BL, word lines WL, Vss lines, and Vcc lines that connect to the memory device 100. As illustrated, the bit lines BL and Vcc line run parallel with the fins 215 and the discontinuous fins 217 while the word line WL and Vss lines run perpendicular with the fins 215 and discontinuous fins 215 and run parallel with the gate electrodes 209.

FIG. 4 illustrates another embodiment in which a single fourth dummy pattern 401 is used to form both of the discontinuous fins 217. In this embodiment the sidewalls of the fourth dummy pattern 401 are utilized to form the two discontinuous fins 217 for the first pull-up transistor 105 and the second pull-up transistor 107 (see FIG. 3K) along the sidewalls of the fourth dummy pattern 401 through a process similar to the one described above with respect to FIGS. 2A-2I. In this embodiment, the fourth dummy pattern 401 may have a second length $l_2$ of between about 0.05 μm and about 1 μm, such as about 0.1 μm, and may have a fourth width $w_5$ of between about 0.05 μm and about 0.3 μm, such as about 0.2 μm.

Additionally, a fifth dummy pattern 403 and a sixth dummy pattern 405 may be located at opposite ends of the unit cell 213. In this embodiment the fifth dummy pattern 403 may be located such that a portion of the fifth dummy pattern 403 is located within the unit cell 213 while another portion may be located outside of the unit cell 213 (e.g., within an adjacent unit cell 213). Similarly, the sixth dummy pattern 405, located on the opposite side of the unit cell 213 from the fifth dummy pattern 403, may be located partially within the unit cell 213 and partially outside of the unit cell 213 (e.g., within an adjacent unit cell 213). In this embodiment the fifth dummy pattern 403 and sixth dummy pattern 405 are each utilized to form a single fin 215, for a total of two continuous fins 215 formed from using the fourth dummy pattern 410, one fin 215 formed using the fifth dummy pattern 403, and one fin 215 formed using the sixth dummy pattern 405.

When used to form a single fin 215, the fifth dummy pattern 403 and sixth dummy pattern 405 may have a third length $l_3$ of between about 0.04 μm and about 0.6 μm, such as about 0.12 μm. Additionally, the fifth dummy pattern 403 and sixth dummy pattern 405 may be spaced from the fourth dummy pattern 401 a second distance $d_2$ of between about 0.05 μm and about 1 μm, such as about 0.1 μm. Such a spacing allows for a smaller spacing of the overall unit cell 213.

Figure 5A:
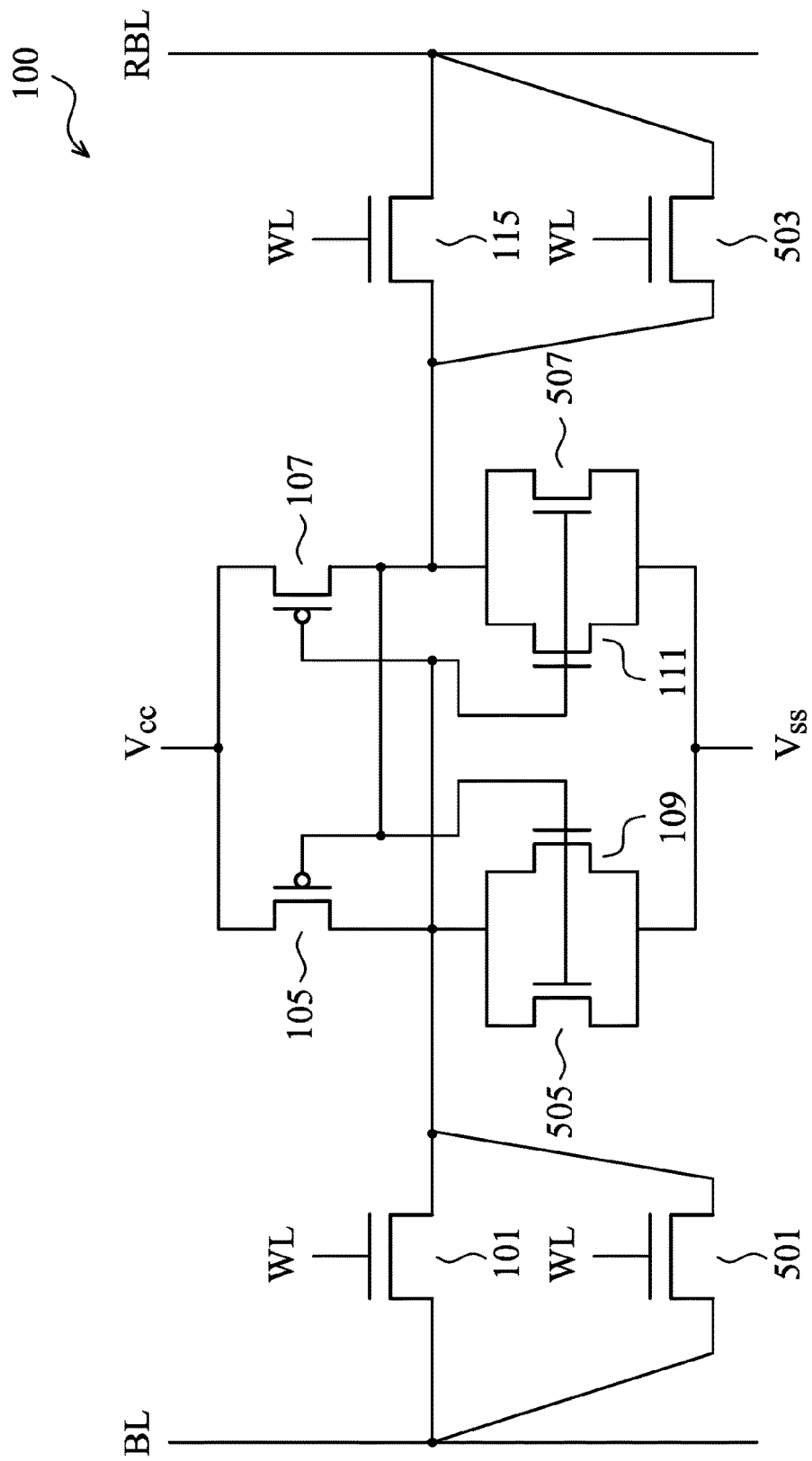
FIGS. 5A-5C illustrate a circuit diagram, plan view, and connection view, respectively, of a ten transistor, single-port SRAM in accordance with an embodiment.
Figure 5B:
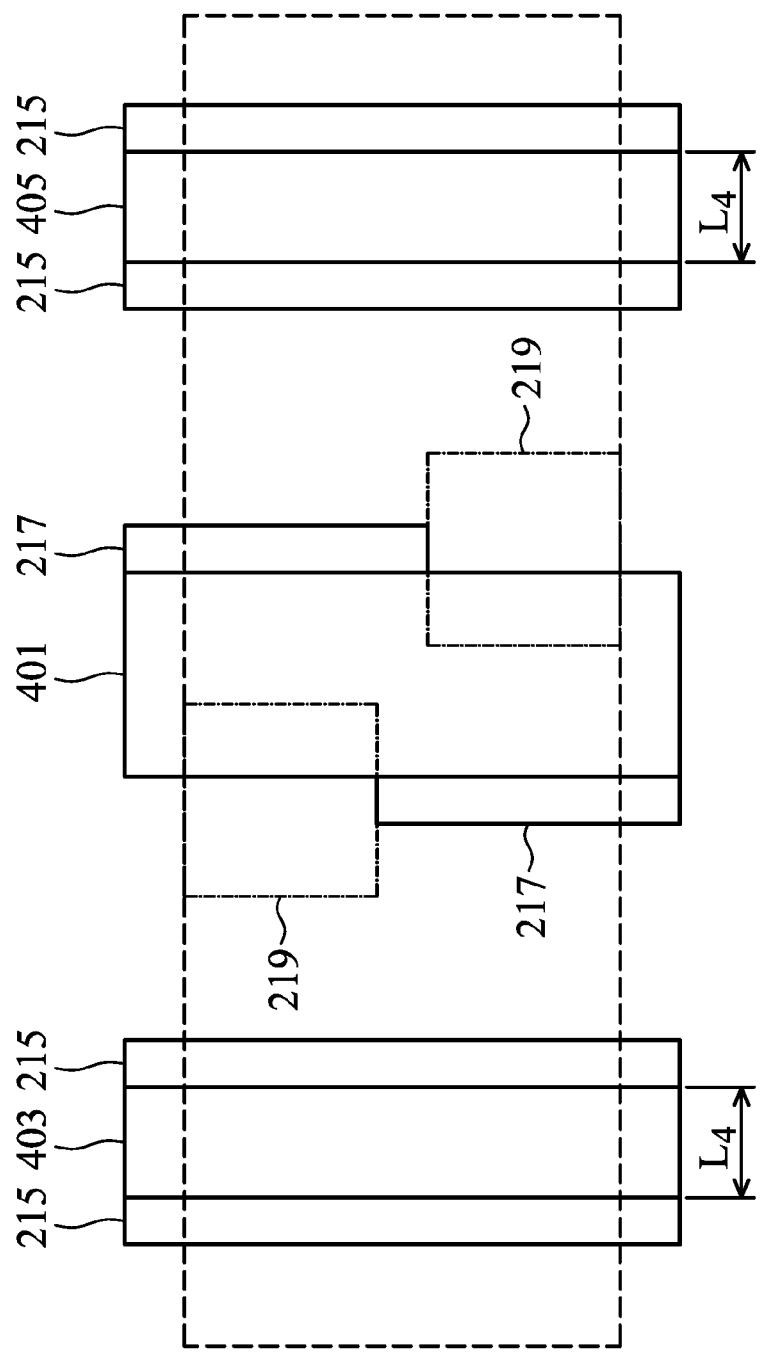
Figure 5C:
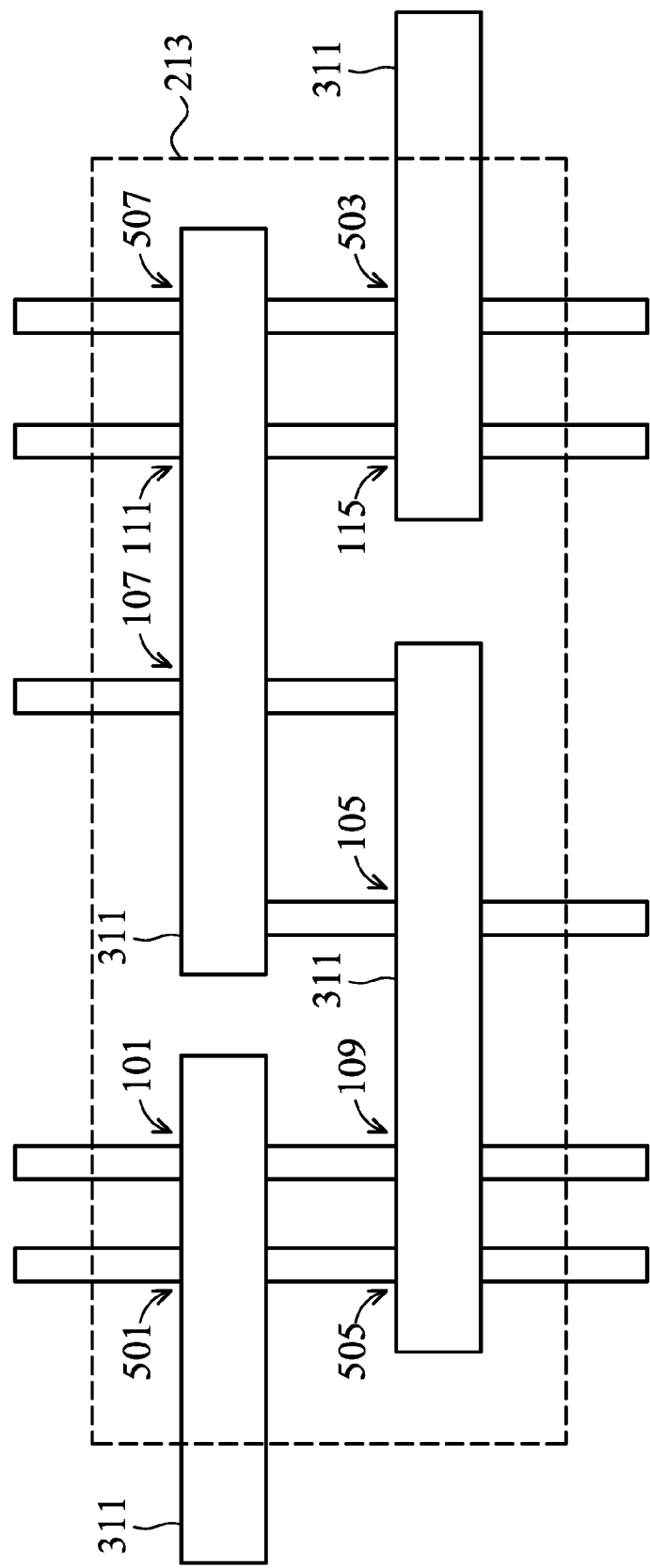

FIGS. 5A-5C illustrate a circuit diagram, plan view of the dummy layers, and connection view, respectively, of an embodiment of a ten transistor, single-port SRAM. In this embodiment there is a third pass-gate transistor 501 connected in parallel with the first pass-gate transistor 101, a fourth pass-gate transistor 503 connected in parallel with the second pass-gate transistor 115, a third pull-down transistor 505 connected in parallel with the first pull-down transistor 109, and a fourth pull-down transistor 507 connected in parallel with the second pull-down transistor 111.

FIG. 5B illustrates that, in this embodiment, the fifth dummy pattern 403 and sixth dummy pattern 405 may each be utilized to form two fins 215 within a single unit cell 213 (instead of each being used to form a single fin as described above with respect to FIG. 4), resulting in a total of four fins 215 and two discontinuous fins 217 located within the unit cell 213. In this embodiment the fifth dummy pattern 403 and sixth dummy pattern 405 may be formed to have a fourth length $l_4$ of between about 0.01 μm and about 0.2 μm, such as about 0.04 μm.

FIG. 5C illustrates that the connectivity of the various transistors in this embodiment. As illustrated, the third pass-gate transistor 501 shares a common gate electrode 311 with the first pass-gate transistor 101 and the fourth pass-gate transistor 503 shares a common gate electrode with the second pass-gate transistor 115. Additionally, the third pull-down transistor 505 shares a common gate electrode with the first pull-down transistor 109, and the fourth pull-down transistor 507 shares a common gate electrode with the second pull-down transistor 111.

Figure 6A:
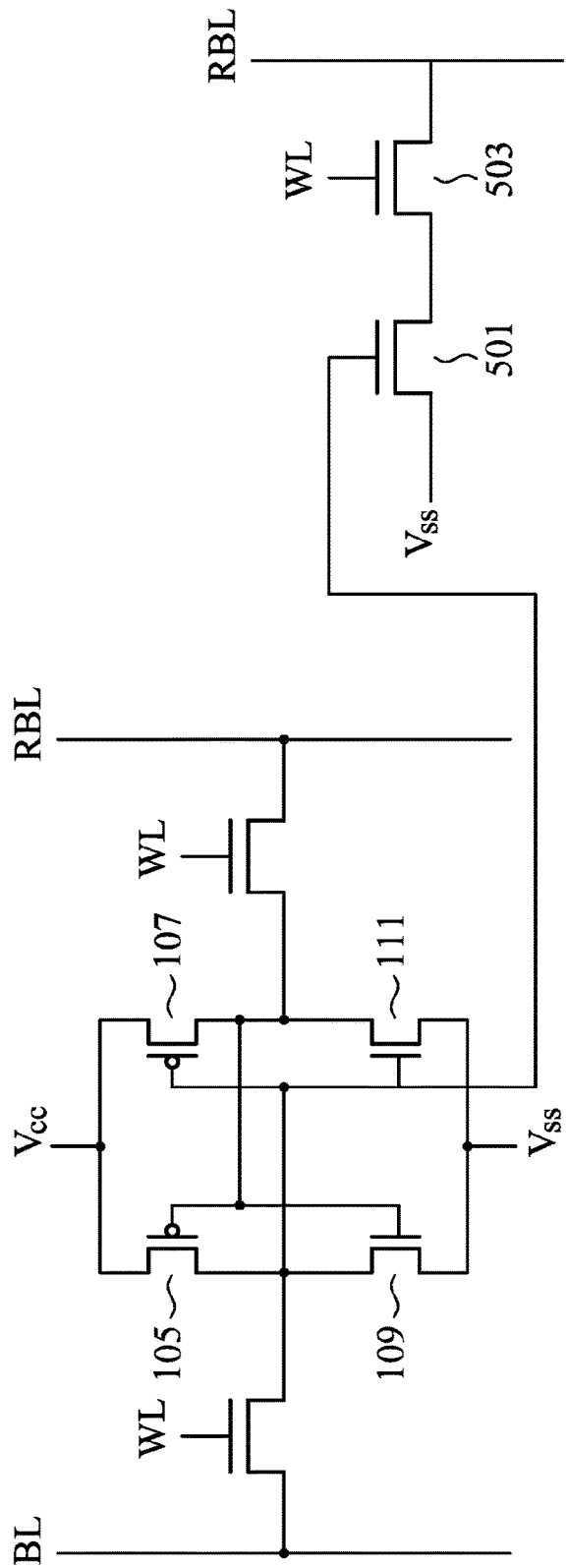
FIGS. 6A-6C illustrate a circuit diagram, plan view, and array view, respectively, of an eight transistor, two-port cell configuration in accordance with an embodiment.
Figure 6B:
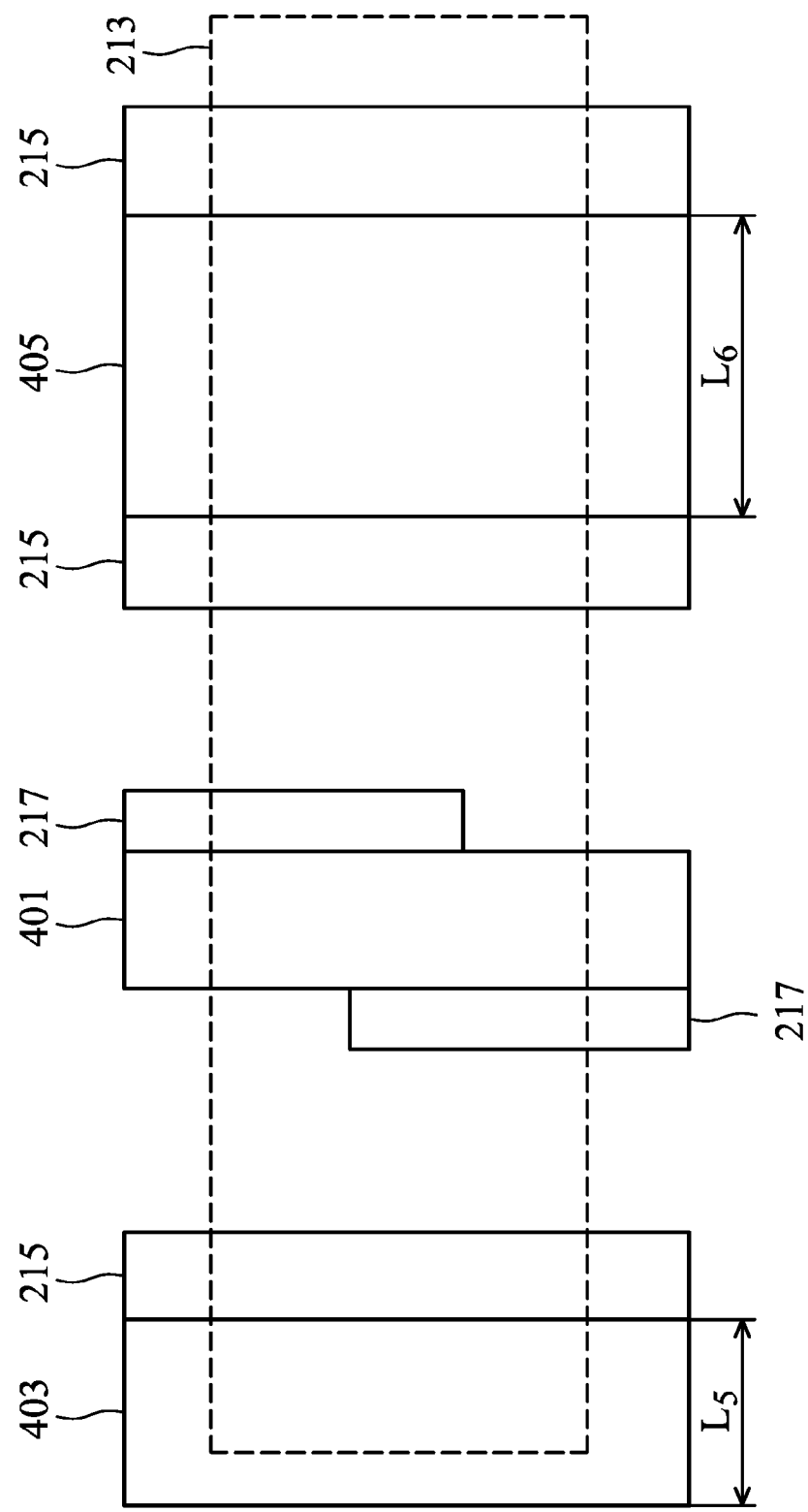
Figure 6C:
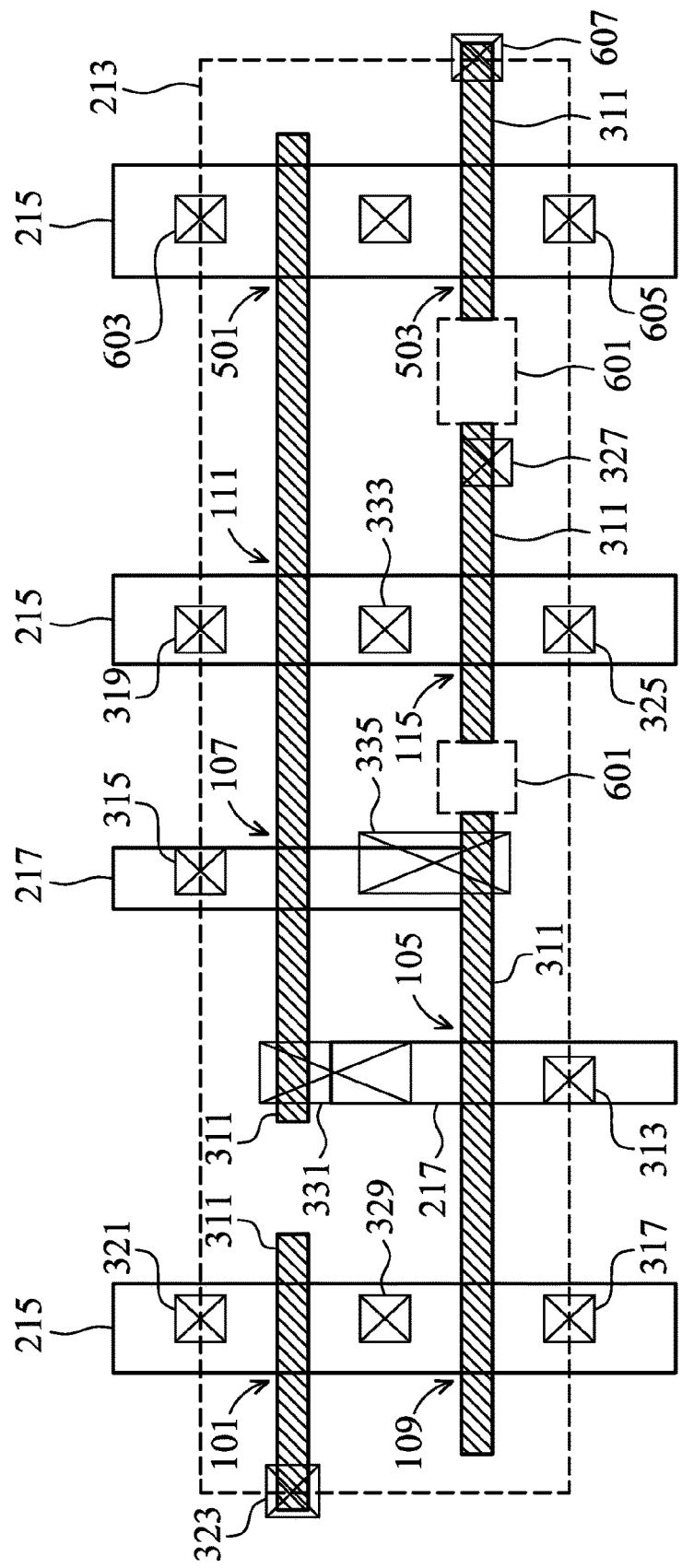

FIGS. 6A-6C illustrate a circuit diagram, plan view, and array view, respectively, of another embodiment which utilizes an eight transistor, two-port cell configuration. As illustrated in FIG. 5A, the drain of the second pull-down transistor 111 is connected to a read-port 500. The read-port comprises a third pull-down transistor 501 and a third pass gate 503 connected in series between the Vss and a read bit line 505. In this embodiment the original bit line and complementary bit-line may be utilized to write to the memory device 100 while the read-port 500 is utilized to read from the memory device 100.

FIG. 6B illustrates that, in this embodiment, the fifth dummy pattern 403 is utilized to form a single fin 215 while the sixth dummy pattern 405 is utilized to form two fins 215 (instead of each being used to form a single fin 215 as described above with respect to FIG. 4) within the unit cell 213, resulting in a total of five fins 215 located within the unit cell 213. In this embodiment the fifth dummy pattern 403 may be formed to have a fifth length $l_5$ of between about 0.04 μm and about 0.6 μm, such as about 0.12 μm, and the sixth dummy pattern 405 are formed to have a sixth length $l_6$ of between about 0.04 μm and about 0.4 μm, such as about 0.1 μm.

FIG. 6C illustrates a plan view of the formation and patterning of the gate electrodes 311 for the eight transistor, two-port cell configuration. As illustrated, two discontinuities (represented in FIG. 6C as dotted lines 601) are made in one of the gate electrodes 311 so as to separate the gate electrodes 311 of the third pass-gate transistor 503, the second pass-gate transistor 115, and the first pull-up transistor 105. Additionally, the source of the third pull-down transistor 501 is connected to Vss through plug 603, the third pull-down transistor 501 shares a common drain with the third pass-gate transistor 503, and the third pass-gate transistor 503 has a drain connected to the read bit-line RBL through plug 605. The gate electrode 311 of the third pass-gate transistor 503 is connected to the word line WL through plug 607.

Although embodiments and their advantages have been described in detail, it should be understood that various changes, substitutions and alterations can be made herein without departing from the spirit and scope of the embodiments as defined by the appended claims. For example, any number of dummy patterns may be utilized to form the various fins, gate dielectrics, and gate electrodes, and the number of dummy patterns presented in the embodiments described herein are not meant to be the only dummy patterns available.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A method for manufacturing an SRAM, the method comprising:
　applying a dummy material to a substrate;
　using the dummy material to help form a masking pattern, wherein the using the dummy material further comprises:
　　forming a first dummy pattern and a second dummy pattern adjacent to the first dummy pattern from the dummy material, wherein the first dummy pattern has a first width and the second dummy pattern has the first width;
　　forming a first spacer along a first sidewall of the first dummy pattern;
　　forming a second spacer along a second sidewall of the first dummy pattern, wherein the second sidewall is opposite to the first sidewall;
　patterning fins from the substrate using the masking pattern, wherein the patterning the fins further comprises forming a first fin by removing first portions of the substrate uncovered by the first spacer and forming a second fin by removing second portions of the substrate uncovered by the second spacer, wherein the removing first portions of the substrate and the removing second portions of the substrate are performed with the first spacer and the second spacer over the substrate, wherein the first spacer is a top-most mask over the substrate during the forming the first fin; and
　removing the masking pattern from over the first fin such that a top surface and sidewalls of the first fin are exposed, the top surface comprising semiconductor material.

2. The method of claim 1, wherein the first width is between about 0.02 µm and about 0.2 µm.

3. The method of claim 1, wherein the first dummy pattern is separated from the second dummy pattern by a distance of between about 0.05 µm and about 1 µm.

4. The method of claim 1, further comprising:
　depositing a gate dielectric over the first fin;
　depositing a gate electrode of the first fin; and
　forming a third dummy material over the gate electrode, wherein the third dummy material has a second width of between about 0.02 µm and about 0.3 µm.

5. The method of claim 4, forming a third spacer on a sidewall of the third dummy material, wherein the third spacer has a third width less than the second width.

6. The method of claim 5, further comprising forming a first gate stack by removing first portions of the gate dielectric and gate electrode uncovered by the third spacer.

7. The method of claim 6, wherein the first gate stack has a width of between about 0.05 µm and about 0.3 µm.

8. A method of manufacturing a semiconductor device, the method comprising:
　forming a first mask and a second mask over a semiconductor substrate, wherein each of the first mask and the second mask has a same width;
　forming spacers on opposing sides of the first mask;
　removing the first mask to expose a first section of the semiconductor substrate between the spacers;
　etching the semiconductor substrate to remove the first section of the semiconductor substrate, wherein the removing the first section of the semiconductor substrate is performed while a surface of the spacers facing away from the semiconductor substrate is exposed;
　removing the spacers to expose a surface of the semiconductor substrate and form a first fin, the first fin being an SRAM fin; and
　patterning the SRAM fin to reduce a length of the SRAM fin.

9. The method of claim 8, wherein the etching the semiconductor substrate forms the first fin along with a second fin, a third fin, a fourth fin, a fifth fin, and a sixth fin in a single unit cell.

10. The method of claim 8, wherein the etching the semiconductor substrate forms the first fin along with a second fin, a third fin, and a fourth fin in a single unit cell.

11. The method of claim 8, wherein the spacers have a curved surface facing away from the semiconductor substrate.

12. The method of claim 8, further comprising forming a gate electrode over the semiconductor substrate, wherein the gate electrode has a width of between about 0.05 µm and about 0.3 µm.

13. The method of claim 8, wherein the same width is between about 0.02 µm and about 0.2 µm.

14. A method of manufacturing a FinFET SRAM device, the method comprising:
　forming a first mask over a semiconductor substrate, the first mask having a first width equal to a minimum dimension of a photolithographic process used to form the first mask and at least less than 0.2 µm;
　using the first mask to form a first spacer with a second width less than the first width, the first mask having a first surface facing away from the semiconductor substrate;
　using the first mask to form a second spacer;
　exposing the first surface and the semiconductor substrate to an etchant to pattern the semiconductor substrate and form sidewalls; and
　after the exposing the first surface to the etchant, removing the first spacer and the second spacer to expose the semiconductor substrate along with the sidewalls.

15. The method of claim 14, wherein the using the first mask to form the first spacer further comprises:
　blanket depositing a spacer material over the first mask; and
　anisotropically etching the spacer material to form the first spacer.

16. The method of claim 14, wherein the using the first mask to form the first spacer and the using the first mask to form the second spacer are performed simultaneously with each other.

17. The method of claim 14, wherein the first spacer has a first length and the second spacer has a second length less than the first length.

18. The method of claim 17, further comprising:
forming at least two gate electrodes within a unit cell over a first portion of the semiconductor substrate that had been previously covered by the first spacer; and
forming no more than one gate electrode within the unit cell over a second portion of the semiconductor substrate that had been previously covered by the second spacer.

19. The method of claim 14, wherein the exposing the first surface to the etchant to pattern the semiconductor substrate forms a first fin which extends between at least two unit cells of the FinFET SRAM device.

20. The method of claim 1, wherein patterning fins from the substrate using the masking pattern also forms a third fin, a fourth fin, a fifth fin, and a sixth fin in a single unit cell.

\* \* \* \* \*